US007746193B2

(12) United States Patent
Hash et al.

(10) Patent No.: US 7,746,193 B2
(45) Date of Patent: Jun. 29, 2010

(54) MINIATURE 180 DEGREE HYBRID COUPLER

(75) Inventors: Ronald J. Hash, Palm Bay, FL (US); Kurt W. Wampach, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 192 days.

(21) Appl. No.: 12/193,920

(22) Filed: Aug. 19, 2008

(65) Prior Publication Data

US 2010/0045403 A1 Feb. 25, 2010

(51) Int. Cl.

*H01P 5/12* (2006.01)
*H03H 7/42* (2006.01)
*H04B 1/52* (2006.01)

(52) U.S. Cl. ........................................ 333/117; 333/25

(58) Field of Classification Search .................. 333/25, 333/26, 109, 110, 111, 112, 115, 116, 117, 333/238

See application file for complete search history.

(56) References Cited

U.S. PATENT DOCUMENTS 5,867,061 A * 2/1999 Rabjohn et al. ......... 330/124 R
6,806,790 B2 * 10/2004 Ji .............................. 333/119
6,993,312 B1 * 1/2006 Salib .......................... 455/326
7,332,960 B2 * 2/2008 Burns et al. ............. 330/124 R

* cited by examiner

*Primary Examiner*—Dean O Takaoka
(74) *Attorney, Agent, or Firm*—Fox Rothschild, LLP; Robert J. Sacco

(57) ABSTRACT

A 180° hybrid coupler (100) includes a first transmission line transformer (101) and a second transmission line transformer (102). Each of the first and second transmission line transformers is comprised of a coplanar stripline structure disposed in a spiral configuration. Each of the coplanar stripline structures has a first characteristic impedance and is configured to function as a balun. A common input feed (202) is coupled to each of the first and second transmission line transformers. A third transmission line transformer (103) and a fourth transmission line transformer (104) are also provided. Each of the third and fourth transmission line transformers is also configured to function as a balun and is coupled to the first and second transmission line transformers.

21 Claims, 3 Drawing Sheets

MINIATURE 180 DEGREE HYBRID COUPLER

BACKGROUND OF THE INVENTION

1. Statement of the Technical Field

The inventive arrangements concern hybrid couplers, and more particularly hybrid couplers having a miniaturized design and capable of producing from a single input signal, two output signals that are 180° out of phase.

2. Description of the Related Art

Hybrid couplers are passive devices used in the field of radio frequency (RF) systems. Typically such hybrid coupler devices can receive an input signal and produce two output signals where the input power is equally divided between two output ports. More particularly, 180° hybrid couplers are four-port devices that can receive an input signal and provide as an output two equally-split but 180 degree phase-shifted output signals. In RF systems, broadband 180° hybrids are frequently used for anti-phase power dividing and combining.

One problem with conventional 180° hybrid couplers is that they include multiple components such as Lange couplers that are a quarter wavelength in size, or in some implementations, transmission line structures that are a half wave length in size or larger. Open space is required around the periphery of such components to ensure their proper operation. These factors can result in a device which requires a large surface area on a circuit board or substrate. The use of high dielectric constant ceramic media and other techniques have been used to miniaturize these devices to some extent. However, for many applications, the overall size of these devices remains prohibitive, especially for lower operating frequencies. Below X-band, conventional coupler designs are generally too large for use in monolithic microwave integrated circuit (MMIC) designs. Ferrite versions of 180° hybrid couplers are also known, and can be made relatively small. However, the upper operating frequency of such devices is limited to about 3 GHz. Broadband ferrite versions of 180° hybrid couplers are also known to suffer from excessive loss at the high end of their operating band.

SUMMARY OF THE INVENTION

The invention concerns a 180° hybrid coupler which includes a first transmission line transformer and a second transmission line transformer. Each of the first and second transmission line transformers is comprised of a coplanar stripline structure disposed in a spiral configuration. For example, a rectangular spiral configuration can be used for this purpose. Each of the coplanar stripline structures has a first characteristic impedance and is configured to function as a balun. A common input feed is coupled to each of the first and second transmission line transformers. According to one aspect of the invention, the common input feed is comprised of a coplanar waveguide.

A third transmission line transformer and a fourth transmission line transformer are also provided. Each of the third and fourth transmission line transformers is also configured to function as a balun and is coupled to the first and second transmission line transformers. The transmission line comprising each of the third and fourth transmission line transformers each has a second characteristic impedance. The third and fourth transmission line transformers are each comprised of coplanar stripline disposed in a spiral configuration. For example, a rectangular spiral configuration can be used for this purpose.

The first, second, third, and fourth transmission line transformers are configured to produce a first output signal from the third transmission line transformer which is approximately 180 degrees out of phase relative to a second output signal from the fourth transmission line transformer when an input signal is applied to the common input feed.

According to an aspect of the invention, the coplanar stripline used in the third and fourth transmission line transformers can each have a second characteristic impedance value that is different from the first characteristic impedance. According to one aspect of the invention, the first characteristic impedance value is approximately equal to the product of the second characteristic impedance and $\sqrt{2}$.

A first resistor is connected between a second output node of the first transmission line transformer and a second output node of the second transmission line transformer. A second resistor is connected between a first output node of the first transmission line transformer and a first output node of the second transmission line transformer. According to one aspect of the invention, the first resistor and the second resistor each have a resistance value approximately equal to a value of the second characteristic impedance.

BRIEF DESCRIPTION OF THE DRAWINGS

Embodiments will be described with reference to the following drawing figures, in which like numerals represent like items throughout the figures, and in which.

DETAILED DESCRIPTION OF THE PREFERRED EMBODIMENTS

Figure 1:
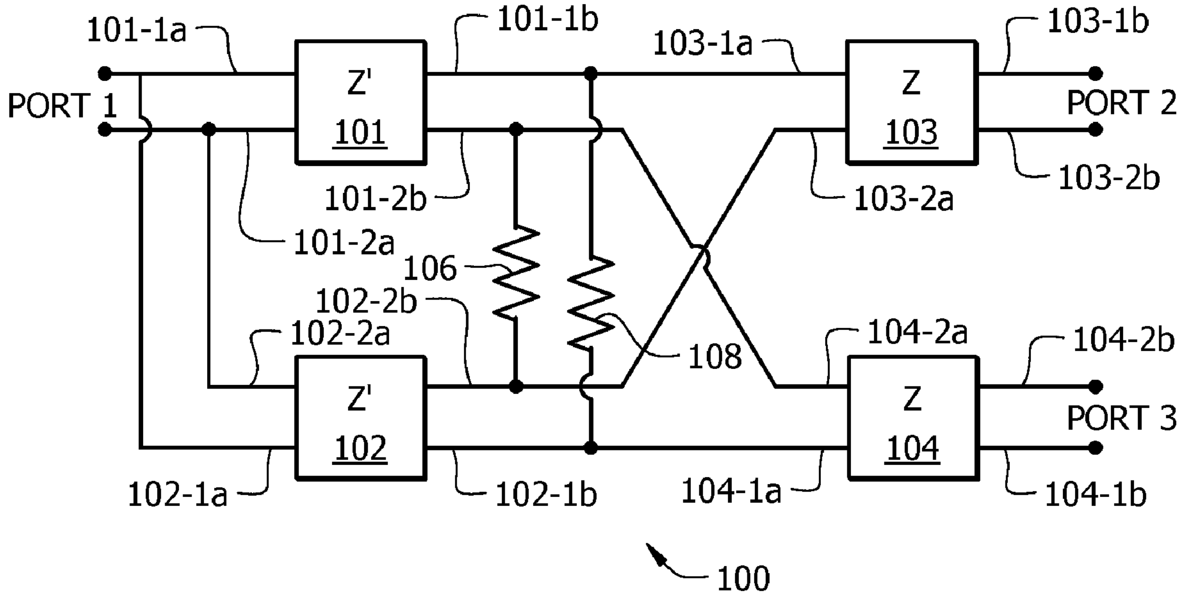
FIG. 1 is a block diagram of a 180° hybrid coupler that is useful for understanding the invention.

A block diagram is provided in FIG. 1 which is useful for understanding a 180° hybrid coupler 100. As illustrated therein, the 180° hybrid coupler 100 includes a first impedance network 101 and a second impedance network 102. Each of the impedance networks 101 and 102 are advantageously configured to function as a balun. As will be appreciated by those skilled in the art, a balun is a passive electronic device that converts between balanced and unbalanced transmission lines. In RF systems, a balanced line or balanced signal pair is generally understood to include a transmission line formed of two conductors of the same type and having equal impedance to ground. It is common for signals transmitted over balanced signal lines to be differential type signals, in which one signal is the inverse of the other. In contrast, an unbalanced line is a transmission line in which the two conductors forming the transmission line have different structures. For example, stripline or microstrip transmission lines usually have one conductive line upon which a signal is transmitted. The second conductor in such systems is a conductive metal ground plane. A balun is generally necessary when signals transition from a balanced to an unbalanced transmission line. As will be appreciated by those skilled in the art, baluns can also be used to step up or step down the impedance levels in a circuit.

Referring to FIG. 1, it can be observed that the first impedance network 101 and the second impedance network 102 are substantially identical. The first impedance network 101 has a first input node 101-1*a*, second input node 101-2*a*, and a first output node 101-1*b* and second output node 101-2*b*. Similarly, the second impedance network 102 has a first input node 102-1*a*, second input node 102-2*a*, a first output node 102-1*b* and a second output node 102-2*b*.

The first and second input nodes 101-1*a*, 101-2*a* of the first impedance network 101 are respectively connected to the first and second input nodes 102-1*a*, 102-2*a* of the second impedance network 102. The common connection of the input nodes for the first and second impedance networks 101, 102 defines port 1 of the 180 hybrid coupler.

Referring again to FIG. 1, a third impedance network 103 and a fourth impedance network 104 are also provided. Each of the impedance networks 103 and 104 are advantageously configured to function as a balun. Each of the third impedance network 103 and fourth impedance network 104 are substantially identical.

The third impedance network 103 has a first input node 103-1*a*, a second input node 103-2*a*, a first output node 103-1*b* and second output node 103-2*b*. Similarly, the fourth impedance network 104 has a first input node 104-1*a*, a second input node 104-2*a*, a first output node 104-1*b* and second output node 104-2*b*. The balun configuration of the impedance networks 103, 104 serves to isolate the balanced input nodes of the impedance networks 101, 102 from the unbalanced output nodes.

The first output node 101-1*b* of the first impedance network 101 is connected to the first input node 103-1*a* of the third impedance network 103. The second output node 101-2*b* of the first impedance network 101 is connected to the second input node 104-2*a* of the fourth impedance network 104.

The first output node 102-1*b* of the second impedance network 102 is connected to a first input node 104-1*a* of the fourth impedance network 104. The second output node 102-2*b* of the second impedance network 102 is connected to the second input node 103-2*a* of the third impedance network.

At relatively low frequencies, a balun can be implemented using a conventional transformer arrangement. For example, each of the first, second, third and fourth impedance networks 101, 102, 103, and 104 could each be implemented using two wires wound upon a balun or toroidal type ferrite core to form a primary and a secondary winding. However, in an embodiment of the invention described herein, each of the first, second, third and fourth impedance networks 101, 102, 103, and 104 are implemented as transmission line transformers. In a transmission line transformer the conductor structure forming a transmission line is also used as a winding, resulting in a device that is capable of very wideband operation. Notably, the first and second impedance networks 101, 102 have a common characteristic impedance Z'. The third and fourth impedance transformers 103, 104 can have a characteristic impedance Z.

The impedance transformers 101, 102, 103, 104 in FIG. 1 can be implemented such that Z=Z'. However, the resulting input impedance at port 1 in that case would be Z/2. In order to ensure that the input impedance at port 1 is the same as the input impedance at ports 2 and 3, it can be advantageous to configure the impedance networks 101, 102, 103, 104 such that the characteristic impedance Z' is different from the characteristic impedance Z. According to an embodiment of the invention, the value of the characteristic impedance value Z' is advantageously selected so that it is approximately equal to the product of the characteristic impedance value Z and $\sqrt{2}$. For example, if the impedance value Z were selected to be 50 ohms, then the impedance value Z' would be approximately 71 ohms. Still, it should be understood that the invention is not limited in this regard.

Referring again to FIG. 1, it can be observed that a first resistor 106 is connected between the second output nodes 101-2*b*, 102-2*b* of the first impedance network 101 and the second impedance network 102. The first resistor acts as a resistive termination and preferably has an impedance value approximately equal to Z, which is equal to the characteristic impedance of the second and third impedance networks 103, 104. A second resistor 108 is connected between the first output nodes 101-1*b* 102-1*b* of the first impedance network 101 and the second impedance network 102, respectively. The second resistor also is provided as a resistive termination and preferably has a resistance value approximately equal to the impedance value Z.

The isolation provided by the first, second, third, and fourth impedance networks 101, 102, 103, 104 and the various electrical connections between such impedance networks as described herein will result in a circuit that functions as a 180° hybrid. Stated differently, this means that the circuit will produce a first output signal from the third impedance network 103 (port 2) which is approximately 180 degrees out of phase and equal amplitude relative to a second output signal from the fourth impedance network 104 (port 3) when an input signal is applied to the first and second impedance networks 101, 102 at port 1. Also, equal amplitude signals of opposite phase applied to networks 103 and 104 are combined and output on port 1. Any portion of the signals applied to networks 103 and 104 that are not of equal amplitude and opposite phase result in an even mode signal which is terminated by resistors 106 and 108 providing isolation to the even mode of propagation.

Figure 2:
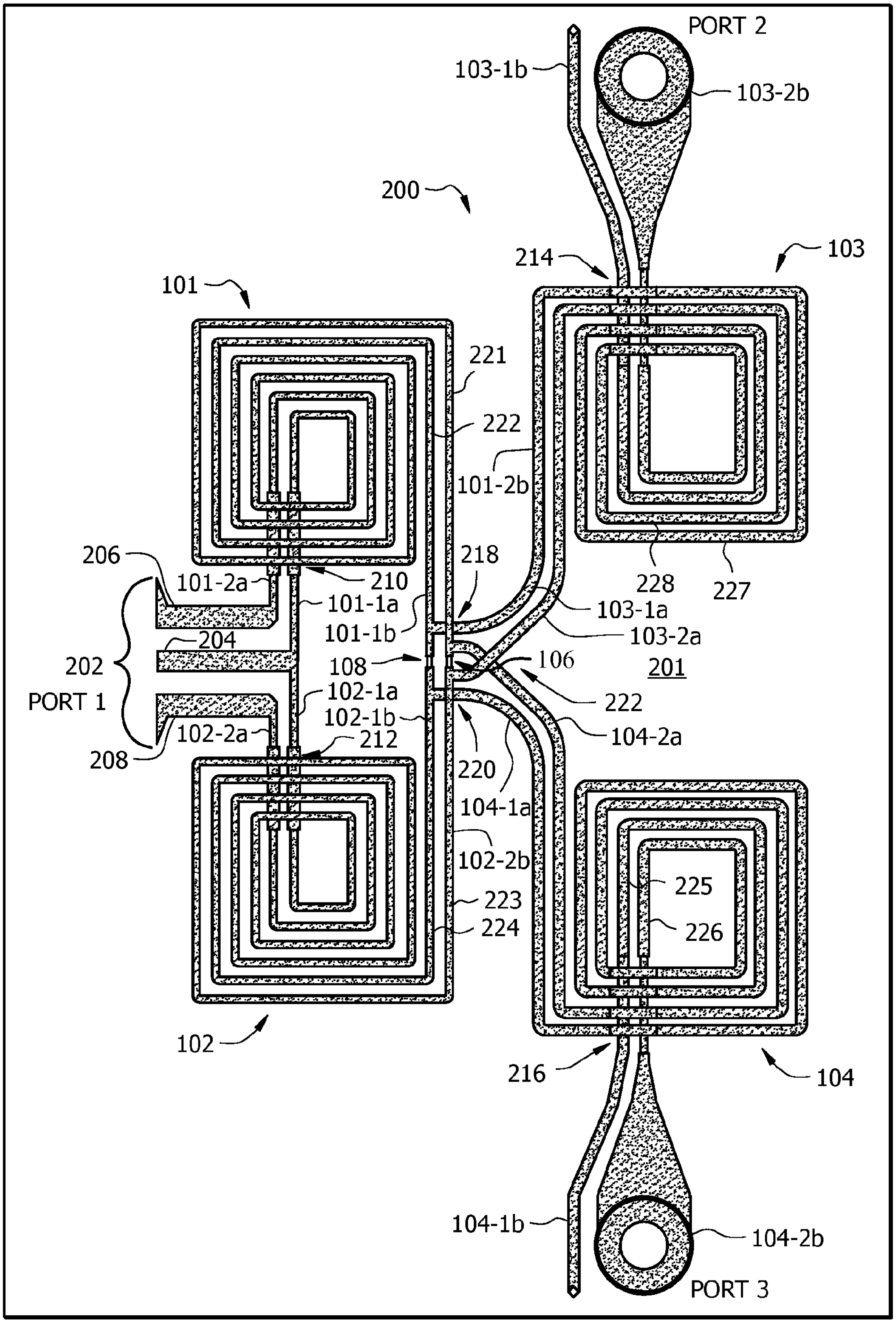
FIG. 2 is an MMIC layout which implements the 180° hybrid coupler shown in FIG. 1, which is useful for understanding the invention.

As noted above, the first, second, third, and fourth impedance networks 101, 102, 103, 104 are transmission line transformers. As will be appreciated by those skilled in the art, transmission line transformers are advantageously formed from a length of transmission line. Referring now to FIG. 2, an MMIC layout 200 is provided which implements the 180° hybrid coupler shown in FIG. 1. It should be understood that the invention is not limited to the particular layout shown in FIG. 2. However, the arrangement shown is advantageous as it offers superior bandwidth for reasons that shall be hereinafter described.

As can be observed in FIG. 2, each of the impedance networks 101, 102, 103, 104 is advantageously implemented from a length of transmission line formed from coplanar stripline. Coplanar stripline transmission line structures are well known in the art and therefore will not be described here in detail. In this invention, CPS allows the transformer networks to be realized in a planar structure well suited to RFIC implementation with the added benefit of bandwidth expansion resulting from mutual inductance derived from the rectangular spiral layout. Also, it should be noted that while coplanar stripline is presently preferred, the invention is not necessarily limited in this regard. Other types of balanced transmission line can also be used with the present invention. For example, slotline or broadside coupled lines could also be used.

As may be observed in FIG. 2, the coplanar stripline (CPS) consists of two parallel strip conductors which are disposed on a dielectric substrate 201 and separated by a narrow gap. In particular, in impedance network 101 the coplanar stripline is comprised of parallel strip conductors 221, 222, in impedance network 102 the coplanar stripline is comprised of parallel strip conductors 223, 224, in impedance network 103 the coplanar stripline is comprised of parallel strip conductors 227, 228, and in impedance network 104 the coplanar stripline is comprised of parallel strip conductors 225, 226.

Each coplanar stripline used to form baluns 101, 102, 103, 104 could be arranged in a simple linear layout, as opposed to the spiral configuration shown. However, it is preferred that the coplanar stripline structure be modified in the present embodiment by arranging the coplanar stripline in a spiral configuration to form the balun in each instance. The spiral configuration is advantageous in this embodiment because it permits a more compact and therefore miniaturized realization of the impedance network. The spiral turns are also advantageous in that they permit inductive coupling to occur between adjacent portions of each individual loop forming the spiral configuration. Such inductive coupling increases usable bandwidth of each impedance network 101, 102, 103, and 104, particularly at the lower end of the operating bandwidth for each device. Notably, the embodiment of the invention shown in FIG. 2 shows a rectangular spiral configuration. However, the invention is not limited in this regard. Instead, other spiral configurations such as a circular spiral configuration could also be used for this purpose.

In FIG. 2, it can also be observed that the spiral configuration of each impedance network 101, 102, 103, 104 results in several intersection points for the coplanar stripline transmission lines. These are identified in FIG. 2 as intersection points 210, 212, 214, 216, 218, 220, and 222. At such locations, certain ones of the parallel strip conductors forming the transmission lines must cross one another as shown. In thick or thin film circuits, this is preferably accomplished by configuring the two parallel strip conductors forming one transmission line to transition to a different layer of the substrate 201. For example, the two parallel strip conductors forming one of the transmission lines can transition from one side of the substrate 201 to an opposing side of the same substrate. In this way, the parallel strip conductors can cross without electrically contacting each other. Such techniques are well known to those skilled in the art. The cross-over in RFIC design is preferably formed by means of an air bridge as opposed to dielectric isolation. Techniques for forming such air bridges are well known to those skilled in the art.

It will be readily appreciated by those skilled in the art that the characteristic impedance of the coplanar stripline will be affected by the width and spacing of the two conductors forming the coplanar stripline. The characteristic impedance can also be modified by selection of a particular substrate material. For example, the dimensions and spacing of the coplanar stripline necessary to achieve a particular characteristic impedance will depend in part on the relative permittivity of the substrate on which the coplanar stripline is disposed. Accordingly, these dimensions and materials can advantageously be selected to obtain a desired characteristic impedance for the coplanar stripline.

The techniques and methods for determining the dimensions necessary for achieving a particular characteristic impedance for coplanar stripline are well known in the art and therefore shall not be described here in detail. However, it should be understood that the spacing between adjacent loops or coils of transmission line forming each impedance network 101, 102, 103, 104 can have an affect on the characteristic impedance of such transmission line. This effect is due to the magnetic and capacitive coupling between adjacent portions of transmission line. Also, there are several design considerations that will determine a desired number of loops or coils required to form a suitable balun in the case of each impedance network 101, 102, 103, 104. For example, each balun must provide effective isolation between the input and output nodes of each impedance transformer. However, it is desirable to also maximize the operating bandwidth of each balun so that the 180° hybrid can operate over the largest possible range of frequencies. In this regard, it is desirable for the device to provide the best possible phase and amplitude tracking over the largest possible range of frequencies. Of course, the return loss and transmission loss of the device are parameters that must also be considered.

In order to optimize the various operating parameters described above, a computer modeling program is advantageously used to determine the actual spacing between each coil or loop of the spiral transmission line structure, the number of such coils or loops, and the exact dimensions of the coplanar transmission line structure. Any suitable RF circuit modeling program can be used for this purpose. For example, computer modeling systems that use a method of moments analysis or finite element analysis can be used for this purpose. Such modeling programs are commercially available from a variety of sources and permit a designer to select certain parameters which are to be optimized by varying the dimensions and other electrical features of the RF structure under analysis. In the present case, the structure can be analyzed to achieve specific phase and amplitude tracking over the largest possible bandwidth, with minimal loss.

Referring once again to FIG. 2, it can be observed that the 180° hybrid coupler includes a single input coupling structure 202 which is implemented as a coplanar waveguide type transmission line. The input coupling structure 202 communicates RF energy to each of the first and second impedance networks 101, 102. As will be appreciated by those skilled in the art, the coplanar waveguide feed is formed from a single center conductor 204 separated from a pair of ground planes 206, 208. In a coplanar waveguide transmission line, the center conductor 204 and ground planes 206, 208 are all disposed on the same plane, atop the dielectric substrate 201. Coplanar waveguide structures are well known in the art. Accordingly, these structures will not be described here in detail. However, the exact dimensions of the coplanar waveguide structures forming the input coupling structure 202 can also be optimized using the computer modeling programs described above.

With the inventive arrangements described herein, a very small scale 180° hybrid coupler can be realized without the use of ferrite materials. The approach described can be implemented in an RF integrated circuit (RFIC) or in a monolithic microwave integrated circuit (MMIC). For example, computer modeling has shown that very small scale 180° hybrid coupler having a useful operational bandwidth extending from 1 GHz to 20 GHz can be fabricated on a substrate 0.004 inches thick, that is 0.02 inches wide and 0.04 inches in length. In contrast, conventional stripline versions of similar devices are 3 inches long and 1.3 inches wide on a substrate that is 0.2 inches thick.

Figure 3:
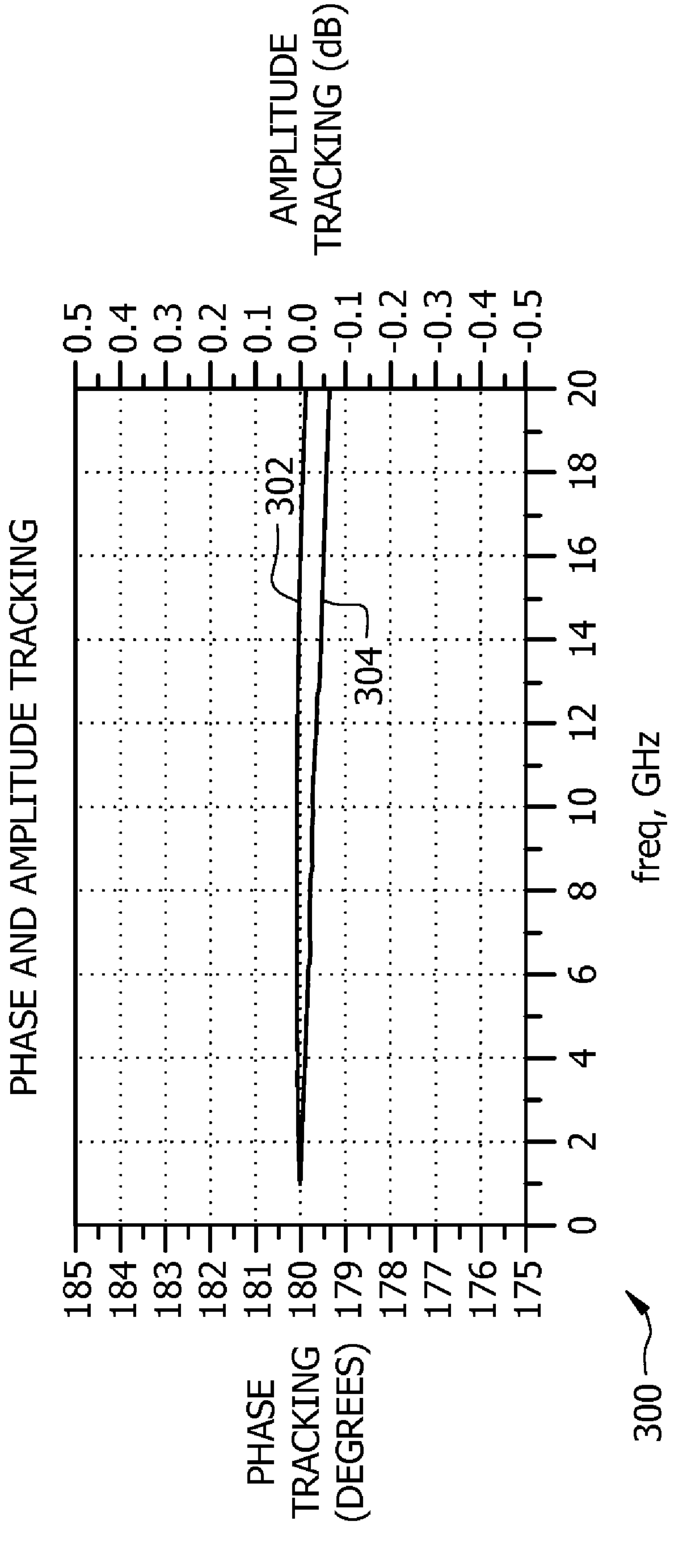
FIG. 3 is a plot showing a predicted performance of the hybrid coupler in FIGS. 1 and 2, based on computer electromagnetic modeling.

Referring now to FIG. 3, there is shown a computer generated plot 300 of predicted phase and amplitude tracking versus frequency for the 180° hybrid in FIG. 2. The amplitude tracking plot 302 shows the difference in signal amplitude at port 2 as compared to port 3 resulting from an input signal at port 1 over the range from 1 GHz to 20 GHz. As shown in FIG. 3, the amplitude tracking has a predicted variation of less than 0.05 dB over the entire frequency range. The phase tracking plot 304 shows the variation in output signal phase at port 2 as compared to port 3 resulting from an input signal at port 1 over the range from 1 GHz to 20 GHz. As can be observed in FIG. 3, the phase tracking has a predicted variation of less than 1 degree over the entire frequency range. The results of the foregoing computer modeling illustrate that the 180° hybrid in FIG. 2 has a usable bandwidth which exceeds a decade in frequency.

The invention described and claimed herein is not to be limited in scope by the preferred embodiments herein disclosed, since these embodiments are intended as illustrations of several aspects of the invention. Any equivalent embodiments are intended to be within the scope of this invention. Indeed, various modifications of the invention in addition to those shown and described herein will become apparent to those skilled in the art from the foregoing description. Such modifications are also intended to fall within the scope of the appended claims.

We claim:

1. A 180° hybrid coupler, comprising:

a first transmission line transformer and a second transmission line transformer, each comprised of coplanar stripline disposed in a spiral configuration, each coplanar stripline having a first characteristic impedance and configured to function as a balun;

a common input feed coupled to each of said first and second transmission line transformers;

a third transmission line transformer and a fourth transmission line transformer, each configured to function as a balun and coupled to said first and second transmission line transformers, said third and fourth transmission line transformers each comprised of coplanar stripline disposed in a spiral configuration, said coplanar stripline having a second characteristic impedance different from said first characteristic impedance;

a first resistor connected between a second output node of said first transmission line transformer and a second output node of said second transmission line transformer;

a second resistor connected between a first output node of said first transmission line transformer and a first output node of said second transmission line transformer; and wherein said first, second, third, and fourth transmission line transformers are configured to produce a first output signal from said third transmission line transformer which is approximately 180 degrees out of phase relative to a second output signal from said fourth transmission line transformer when an input signal is applied to said common input feed.

2. The 180° hybrid coupler according to claim 1, wherein said first characteristic impedance value is approximately equal to the product of the second characteristic impedance and $\sqrt{2}$.

3. The 180° hybrid coupler according to claim 1, wherein at least one of said first resistor and said second resistor has a resistance value approximately equal to a value of said second characteristic impedance.

4. The 180° hybrid coupler according to claim 1, wherein said spiral configuration is a rectangular spiral.

5. The 180° hybrid coupler according to claim 1, wherein said common input feed is comprised of a coplanar waveguide.

6. A 180° hybrid coupler, comprising:

a first impedance network and a second impedance network, each configured to function as a balun, said first impedance network and said second impedance network each having a first characteristic impedance; a first and second input node, and a first and second output node;

said first and second input node of said first impedance network respectively connected to said first and second input node of said second impedance network;

a third impedance network and a fourth impedance network, each configured to function as a balun, said third and fourth impedance network each having a second characteristic impedance, a first and second input node, and a first and second output node;

a first output node of said first impedance network connected to said first input node of said third impedance network, and said second output node of said first impedance network connected to said second input node of said fourth impedance network;

said first output node of said second impedance network connected to a first input node of said fourth impedance network, and said second output node of said second impedance network connected to said second input node of said third impedance network;

a first resistor connected between said second output nodes of said first impedance network and said second impedance network;

a second resistor connected between said first output nodes of said first impedance network and said second impedance network;

wherein said first, second, third, and fourth impedance networks are transmission line transformers comprised of coplanar stripline;

wherein said transmission line transformers are configured to produce a first output signal from said third impedance transformer, which is approximately 180 degrees out of phase relative to a second output signal from said fourth impedance transformer, when an input signal is applied to said first and second input nodes of said first and second impedance transformers.

7. The 180° hybrid coupler according to claim 6, wherein each of said transmission line transformers are disposed in a spiral configuration.

8. The 180° hybrid coupler according to claim 7, wherein said spiral configurations are rectangular spirals.

9. The 180° hybrid coupler according to claim 6, wherein said first characteristic impedance is a different value compared to said second characteristic impedance.

10. The 180° hybrid coupler according to claim 6, wherein said first characteristic impedance value is approximately equal to the product of the second characteristic impedance and $\sqrt{2}$.

11. The 180° hybrid coupler according to claim 6, wherein at least one of said first resistor and said second resistor has a resistance value approximately equal to a value of said second characteristic impedance.

12. The 180° hybrid coupler according to claim 6, further comprising a single coplanar waveguide feed coupled to each of said first and second impedance transformers.

13. A 180° hybrid coupler, comprising:

a first impedance network and a second impedance network, each configured as a balun and having a first characteristic impedance; a first and second input node, and a first and second output node;

said first and second input node of said first impedance network respectively connected to said first and second input node of said second impedance network;

a third impedance network and a fourth impedance network, each configured as a balun and having a second characteristic impedance, a first and second input node, and a first and second output node;

a first output node of said first impedance network connected to said first input node of said third impedance network, and said second output node of said first impedance network connected to said second input node of said fourth impedance network;

said first output node of said second impedance network connected to a first input node of said fourth impedance network, and said second output node of said second impedance network connected to said second input node of said third impedance network;

a first resistor connected between said second output nodes of said first impedance network and said second impedance network;

a second resistor connected between said first output nodes of said first impedance network and said second impedance network;

wherein said first, second, third, and fourth impedance networks are configured to produce a first output signal from said third impedance network which is approximately 180 degrees out of phase relative to a second output signal from said fourth impedance network when an input signal is applied to said first and second impedance networks.

14. The 180° hybrid coupler according to claim 13, wherein at least one of said first, second, third, and fourth impedance networks are formed from a length of transmission line.

15. The 180° hybrid coupler according to claim 14, wherein said transmission line is coplanar stripline.

16. The 180° hybrid coupler according to claim 15, wherein said coplanar stripline is disposed in a spiral configuration.

17. The 180° hybrid coupler according to claim 16, wherein said spiral configuration is a rectangular spiral configuration.

18. The 180° hybrid coupler according to claim 13, further comprising a coplanar waveguide feed coupled to each of said first and second impedance networks.

19. The 180° hybrid coupler according to claim 13, wherein said first characteristic impedance is a different value compared to said second characteristic impedance.

20. The 180° hybrid coupler according to claim 13, wherein said first characteristic impedance value is approximately equal to the product of the second characteristic impedance and $\sqrt{2}$.

21. The 180° hybrid coupler according to claim 13, wherein at least one of said first resistor and said second resistor has a resistance value approximately equal to a value of said second characteristic impedance.

* * * * *